United States Patent
Lynch

(10) Patent No.: US 7,091,777 B2
(45) Date of Patent: Aug. 15, 2006

(54) CONTROLLER FOR AN RF POWER AMPLIFIER

(75) Inventor: Michael Anthony Lynch, Denville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 319 days.

(21) Appl. No.: 10/259,601

(22) Filed: Sep. 30, 2002

(65) Prior Publication Data

US 2004/0061555 A1 Apr. 1, 2004

(51) Int. Cl.
H03G 3/20 (2006.01)

(52) U.S. Cl. .................... 330/136; 330/127; 330/149

(58) Field of Classification Search ................ 330/123, 330/127, 129, 136, 279, 297, 10; 455/114.3, 455/127.1
See application file for complete search history.

(56) References Cited

U.S. PATENT DOCUMENTS

| | | | | |
|---|---|---|---|---|
| 4,873,493 A | * | 10/1989 | Fujiwara | 330/285 |
| 5,787,336 A | * | 7/1998 | Hirschfield et al. | 455/13.4 |
| 5,826,170 A | * | 10/1998 | Hirschfield et al. | 330/129 |
| 5,831,475 A | * | 11/1998 | Myers et al. | 330/136 |
| 5,861,777 A | * | 1/1999 | Sigmon et al. | 330/136 |
| 5,936,464 A | * | 8/1999 | Grondahl | 330/136 |
| 5,942,938 A | * | 8/1999 | Myers et al. | 330/207 A |
| 5,977,831 A | * | 11/1999 | Davis et al. | 330/279 |
| 6,064,269 A | * | 5/2000 | Ruppel et al. | 330/297 |
| 6,091,934 A | * | 7/2000 | Berman et al. | 455/13.4 |
| 6,157,253 A | * | 12/2000 | Sigmon et al. | 330/124 R |
| 6,437,641 B1 | * | 8/2002 | Bar-David | 330/10 |
| 6,621,350 B1 | * | 9/2003 | Verbist et al. | 330/297 |
| 6,624,712 B1 | * | 9/2003 | Cygan et al. | 332/106 |
| 6,639,471 B1 | * | 10/2003 | Matsuura et al. | 330/297 |
| 6,677,819 B1 | * | 1/2004 | Hakala et al. | 330/136 |
| 6,696,866 B1 | * | 2/2004 | Mitzlaff | 330/308 |
| 6,703,897 B1 | * | 3/2004 | O'Flaherty et al. | 330/136 |
| 6,714,071 B1 | * | 3/2004 | Page | 330/136 |
| 6,741,127 B1 | * | 5/2004 | Sasho et al. | 330/136 |
| 6,788,151 B1 | * | 9/2004 | Shvarts et al. | 330/297 |
| 2002/0171481 A1 | * | 11/2002 | Sasho et al. | 330/129 |
| 2003/0146791 A1 | * | 8/2003 | Shvarts et al. | 330/297 |

* cited by examiner

*Primary Examiner*—Khanh Van Nguyen

(57) ABSTRACT

The controller controls the amplifier and a modulated power supply, supplying power to the amplifier, by detecting an RF envelope of a signal input to the amplifier. Predistortion of the amplifier synchronous with changes of bias is provided using a look-up table. Specifically, amplitude predistortion, phase predistortion and DC voltage level adjustments are made to the RF signal. Adjustments for gain and phase variation are applied synchronously with bias changes.

18 Claims, 4 Drawing Sheets

CONTROLLER FOR AN RF POWER AMPLIFIER

FIELD OF THE INVENTION

The present invention relates generally to radio frequency (RF) amplifiers.

BACKGROUND OF THE INVENTION

Amplifiers produce from an input signal, an output signal having an increased magnitude (i.e., gain). Essentially, an amplifier produces a constant output power at a higher level. Different amplifiers are known and produce various types of gains (e.g., voltage and/or current gain). Amplifiers are rated at a maximum power output for use in different applications. The most efficient output for an amplifier typically occurs when operating at the highest rated output. However, amplifiers are often operated at an average power much lower than the highest rated output in order to achieve a linear output. Therefore, there is a tradeoff between efficiency and linearity.

An ideal power amplifier amplifies an input signal with no waveshape alteration. The ideal power amplifier is therefore characterized as having a transfer function (input signal vs. output signal) which is linear with no transfer function discontinuities. In practice, however, a power amplifier has a transfer function with nonlinear and "linear" regions. Whether the power amplifier is operating in a linear or nonlinear region depends in part on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses amplitudes which cause the amplifier to compress, to saturate (no appreciable increase in output amplitude with an increase in input amplitude) or to shut-off (no appreciable decrease in output amplitude with a decrease in input amplitude), the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, such as Global System for Mobile Communications (GSM) or North American TDMA, when multiple carrier signals are combined for amplification with a power amplifier, the resulting PAR is about 9–10 dB for a large number of carriers. In a code division multiple access (CDMA) system, a single loaded 1.25 Mhz wide carrier can typically have a PAR of 11.3 dB. For orthogonal frequency division multiplexing (OFDM), multicarrier signals can have a PAR of up to 20 dB. These signals have to be amplified fairly linearly to avoid generating ACP.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between cutoff and saturation. Class B amplifiers are biased near cutoff, resulting in a rectified drain current waveform. Class AB amplifiers are biased in between the bias points of classes A and B.

Known RF amplifiers have been designed to linearly amplify the peak power of the amplifier rather than the average power (i.e., output only peak power during operation). However, peak power is not continuous, and such designs result in inefficient operation of the RF amplifiers. For example, a 100 watt (W) amplifier may be used to produce 10 W of average power with a peak-to-average power ratio of 10 dB. Operating an amplifier under these conditions can result in an efficiency as low as 5 percent.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive.

These very stringent standards have resulted in increased difficulty and complexity in designing efficient RF power amplifiers. Specifically, RF amplifiers must provide spectrally pure (i.e., linear) operation and must be capable of amplifying the peak power content without saturation. During operation of RF power amplifiers, the instantaneous RF envelope power may vary in excess of 10 decibels (dB), which is particularly present in multi-carrier applications. Further, amplifiers in these digital wireless systems must be rated to operate during peak power periods (e.g., during the instantaneous vector sum of multiple RF carrier waveforms), which may occur for only very short durations (e.g., hundredths of nanoseconds). Use of lower rated amplifiers would result in clipping of signals above the highest rated output of the amplifier during those peak power periods and cause interference across communication channels.

Various linearization methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path.

Predistortion techniques are commonly used to improve the performance of RF power amplifiers. Predistortion techniques distort the input signal prior to amplification by taking into account the transfer function characteristics for the amplifier. The desired amplified signal is achieved from the predistorted input signal by intentionally distorting the signal before the amplifier, so the non-linearity of the amplifier can be compensated.

Predistortion techniques require prior understanding of the response of the amplifier. Both pure digital and RF/digital predistortion implementations use polynomial approximation to predict the amplitude and phase distortion of the RF amplifier from which the predistortion function is determined. Alternatively, the predistortion function can be directly determined using inputs and outputs of the amplifier. In any event, adaptive predistortion systems monitor the signals prior to and after the power amplifier to determine the predistortion function, for example by updating the coefficients of the amplifier characteristics polynomial and calculating the inverse of the amplifier characteristics polynomial. Improving the detection of signals prior to and after the amplifier can improve the determination of the predistortion function, thereby improving the performance of the predistortion system. For example, the improved detection of signals prior to and after the amplifier can improve the determination of the amplifier characteristics function from which a better inverse function can be obtained. In a standard predistortion system implementation, the input signal envelope is detected and used as a pointer to a look-up table which implements the predistortion function. The values of the look-up table are passed to a digital to analog (D/A) converter that modulates or predistorts the input signal to compensate for the distortion of the amplifier. Improvement in amplifier performance is constrained by how well the signals used in the determination of the predistortion system are detected for different input signal levels.

With respect to digital wireless systems, many parts of base stations for these systems (e.g., cellular telephone systems), including RF amplifiers, have decreased in size as a result of improvements in lower power digital circuitry and use of application-specific integrated circuits (ASICs). However, the total size reduction of such systems, and in particular, the component parts, including specifically RF amplifiers, is limited by the amount of heat dissipated by the RF power stages of the RF amplifiers and the associated power supply design. Improvements in the efficiency of the RF power stages in the RF amplifiers would result in further size and weight reductions in the base stations, as well as lower overall power consumption.

SUMMARY OF THE INVENTION

A controller of the present invention provides modulated power supply to an amplifier based upon tracking an envelope of an RF signal. For example, the RF envelope signal is sampled with correction values applied to compensate for distortion (i.e., predistortion) and also to provide bias changes to a power supply output. The predistortion correction values are adjusted synchronously with changes to the power supply bias. Thus, power to the amplifier is varied synchronously with the change in the RF envelope power, thereby resulting in a more efficient amplifier that has lower power dissipation.

In one embodiment of the present invention a controller for use with an RF amplifier includes a power supply for supplying power to the RF amplifier and a control unit for detecting an RF envelope of a signal input to the RF amplifier to provide predistortion and for controlling the power supply based upon the detected RF envelope. The control unit may be configured for controlling the power supply such that power output from the power supply is varied linearly. The control unit preferably also includes a look-up table having correction values (e.g., amplitude predistortion, phase predistortion and voltage correction values) that are addressed based upon the detected RF envelope signal and performs predistortion based upon the correction values. A micro-controller and interface may be used for modifying the correction values.

An RF amplifier according to an embodiment of the present invention includes a plurality of power stages providing power amplification, a power supply for supplying power to the RF amplifier, and a control unit for detecting an RF envelope of a signal input to the RF amplifier to provide predistortion and for controlling the power supply based upon the detected RF envelope. The plurality of power stages may include a preamp stage, a driver stage and a power stage, with the control unit configured for controlling power supplied to the driver stage and power stage. The control unit preferably includes a look-up table having correction values that are addressed based upon the detected RF envelope signal and performs predistortion based upon the correction values. A micro-controller and interface may be used to modify the correction values.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses. Although the present invention is described in connection with specific component parts operating under specific conditions to control a particular amplifier, it is not so limited, and different or additional component parts may be implemented as part of the invention.

Generally, the present invention provides a controller for an RF power amplifier to increase its efficiency. Essentially, the power supplied to an RF power stage of the amplifier is modulated as the instantaneous RF envelope power changes. During operation, when the envelope power changes, variations in gain, phase and bias (i.e., direct current (DC) voltage) are compensated for synchronously using a digital look-up table and polar modulation. A type of RF predistortion (i.e., linearization) is thereby provided that offsets nonlinear effects and gain errors. In particular, the linearization is associated with bias control to provide linearization of an amplifier synchronous with change in bias.

A structural description of a controller constructed according to the principles of the present invention will first be described followed by an operational description. However, before providing a detailed structural description of the invention and its operation, a general description of amplifiers will be provided.

Figure 1:
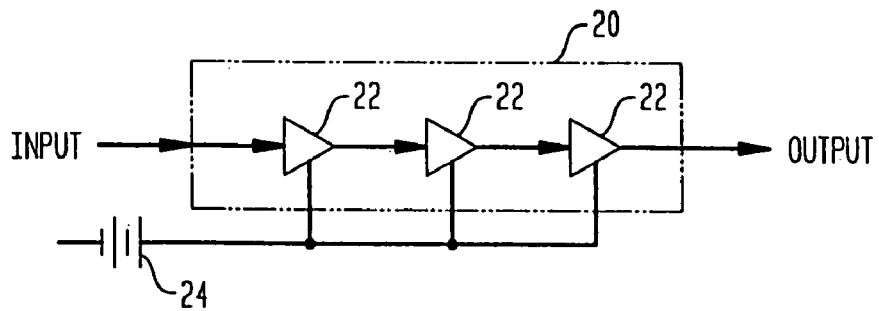
FIG. 1 is a block diagram of an multi-stage amplifier in connection with which a controller of the present invention may be implemented.

In general, and as illustrated in FIG. 1, an amplifier 20 typically includes one or more power stages 22 for amplifying (e.g., providing power gain) an input signal to produce and output signal at a higher level (i.e., higher power level). The power stages 22 may include, for example, a preamp stage, a driver stage and a power stage, with each stage providing additional gain to the signal. A constant power supply 24 is typically used to power the various power stages 22.

Figure 2:
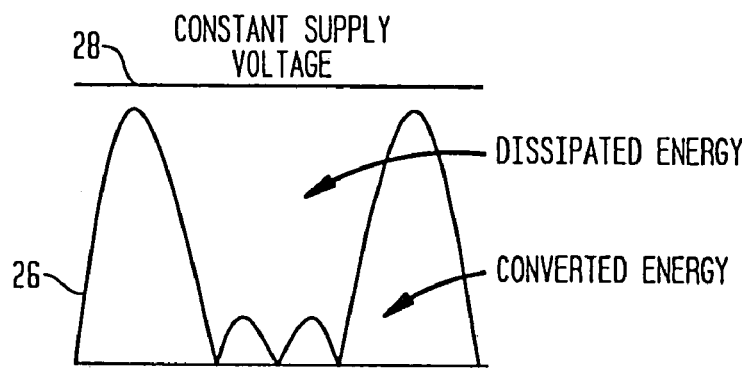
FIG. 2 is a waveform illustrating power dissipation in an amplifier having a constant supply voltage.

Use of a constant power supply 24 results in inefficiencies during operation of the amplifier 20 in the form of dissipated energy as illustrated in FIG. 2. As shown therein, the constant power supply 24 fails to follow the power requirements of the amplifier as represented by the signal curve 26. As can be seen, converted energy is represented within (i.e., below) the signal curve 26 and the dissipated energy is represented outside the signal curve 26, i.e., above the signal curve 26 and below the constant supply voltage line 28. Tracking of the signal curve 26 (i.e., RF envelope signal) would result in more efficient operation and less dissipated energy.

Structural Description

Figure 3:
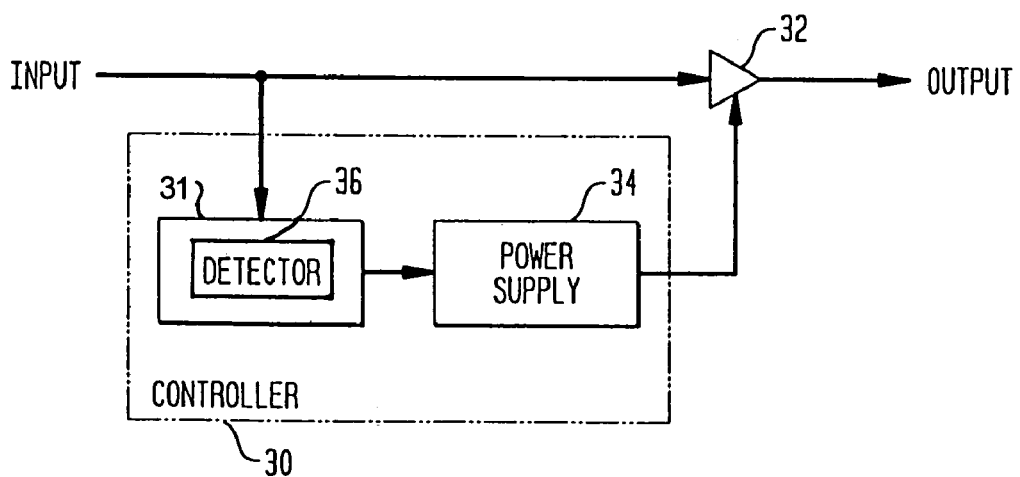
FIG. 3 is a block diagram of a controller constructed according to the principles of the present invention.

FIG. 3 generally illustrates an embodiment of a controller 30 constructed according to the principles of the present invention. The controller 30 includes a control unit 31 for controlling an amplifier 32 and a modulated power supply 34. The control unit 31 includes a detector 36 for detecting (i.e., tracking) the input RF power envelope. Variations in gain, phase and bias (i.e., DC voltage) of the input signal are corrected based upon changes in the envelope power. In particular, the power supply 34 is varied based upon detected changes to the envelope. When reference is made to a power envelope signal or envelope signal, this refers to a signal (e.g., RF signal) having a modulated component (e.g., amplitude-modulated signal). It should be noted that the controller 30 may be integrated with the amplifier 32 or provided as a separate unit. Further, the power supply 34 may be provided integrated with or separate from the controller 30.

Figure 4:
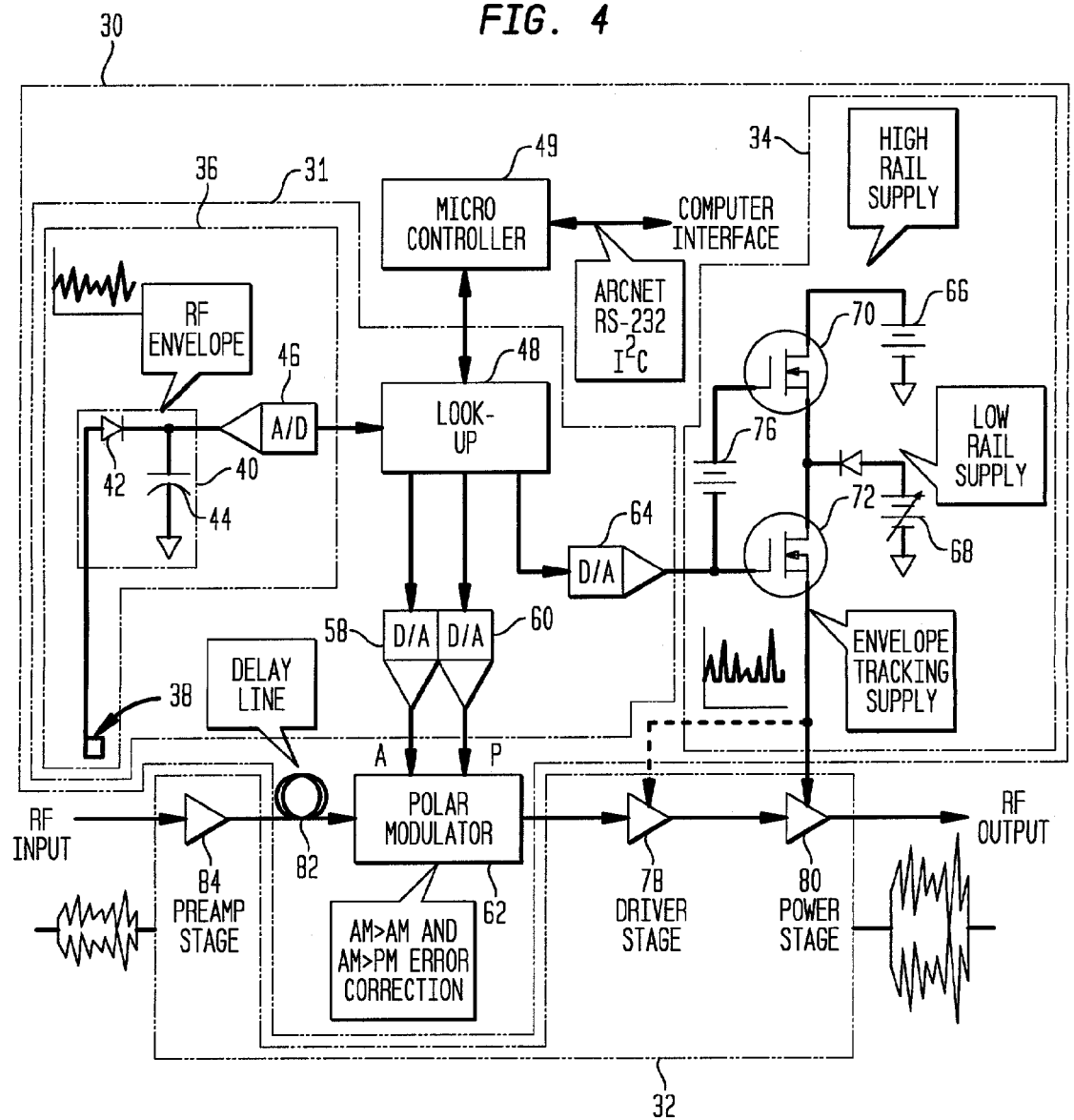
FIG. 4 is a detailed schematic block diagram of the controller of FIG. 3.

A more detailed illustration of an embodiment of a controller 30 of the present invention having a control unit 31 for controlling the amplifier 32 and power supply 34 is shown in FIG. 4. Specifically, the detector 36 within the control unit 31 includes a directional coupler 38 for sampling the input RF envelope signal. The directional coupler 38 preferably samples a small portion of the RF input signal at a reduced power level. The directional coupler 38 is connected to an envelope detector 40. The envelope detector 40 comprises a diode 42 for rectifying the sampled signal to obtain a DC representation of the input RF envelope signal and a capacitor 44 for filtering the RF component of the envelope signal to provide a rectified DC representation of the envelope signal without the RF component. It should be noted that the envelope detector 40 may be constructed in any known manner.

An analog-to-digital (A/D) converter 46 is connected to the output of the envelope detector 40 for converting the analog rectified DC sampled signal to a digital representation (i.e., digitizes the RF envelope signal to provide a discrete digital value). A look-up table 48, which is preferably provided as part of the control unit 31, is connected to the output of the A/D converter 46, and provides amplitude predistortion, phase predistortion and bias (i.e., DC voltage) correction to the RF input signal and amplifier 32. The look-up table 48 preferably includes correction values for each possible instantaneous amplitude value of the RF input envelope signal (i.e., from a minimum value to the highest rated voltage for the amplifier 32). A particular resolution is provided, for example, a value may be provided for each 0.1 DC volt change in the converted digital representation (i.e., digital value). Further, values in the look-up table 48 may be modified or changed based upon external conditions, such as, for example, operating temperature and frequency, among others. Changes to and control of values in the lookup table 48 are preferably provided using a microcontroller 49 that interfaces with a computer. Other controls may be used in connection with the controller 30 to modify the look-up table 48, including, for example, an erasable programmable read-only memory (EPROM) programmer.

Figure 5:
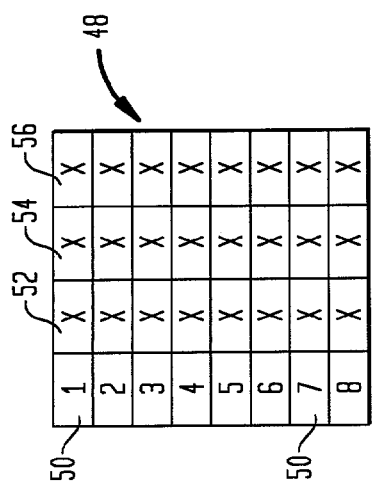
FIG. 5 is a representation of a look-up table of a controller of the present invention.

Each digital value from the A/D converter 46 is an address pointer to an address 50 in the look-up table 48 as shown in FIG. 5. For each address 50, a specific phase correction value 52, amplitude correction value 54 and bias (i.e., DC voltage) correction value 56 are provided. The look-up table 48 may be stored within any suitable memory storage device, for example, an EPROM. A first digital-to-analog (D/A) converter 58 connected the look-up table 48 provides an analog amplitude correction level (i.e., predistortion) from the digital amplitude correction value 54 to compensate for amplitude changes in the RF signal. A second D/A converter 60 connected to the look-up table 48 provides an analog phase correction level (i.e., predistortion) from the digital phase correction value 52 to compensate for phase changes in the RF signal. A polar modulator 62 as is known applies the correction values to the RF signal in a known manner to provide predistortion. For example, an amplitude modulator and phase modulator connected in series may provide modulation control inputs to control magnitude (or amplitude) and phase. A third D/A converter 64 connected to the look-up table 48 provides a bias correction level from the digital bias correction value 56 to modulate the DC voltage supplied in the amplifier 32 by the power supply 34. This bias correction is provided synchronous with the predistortion.

The power supply 34 includes first and second transistors 70 and 72 connected in series between a high rail power source 66 and the amplifier 32. A diode 74 and a low rail power source 68 are connected in series between ground and the common node of the first and second transistors 70 and 72. Also, a bias voltage source 76 is connected between the gates of the first and second transistors 70 and 72, and the gates of the first and second transistors receive the output of the third D/A converter 64. The low rail power source 68 defines a low voltage threshold level, preferably based upon the average power of the output of the amplifier 32, and the high rail power source 66 defines a high voltage threshold level for supplying power to the amplifier 32, preferably based upon the peak value for the amplifier 32. The low rail power source 68 is preferably adjustable. Further, the first and second transistors 70 and 72 are preferably n-type metal-oxide-silicon field-effect transistors (MOSFETs) selected based upon the power requirements of the amplifier 32.

The modulated output of the power supply 34 is connected to the amplifier 32. The modulated output of the power supply 34 may be provided to power different stages of the amplifier 32, including, for example, the driver stage 78 and/or the power stage 80. A delay line 82 is connected between a preamp stage 84 of the amplifier 32 and the polar modulator 62 to provide delay, which is needed as a result of the delay through the control unit 31.

Figure 6:
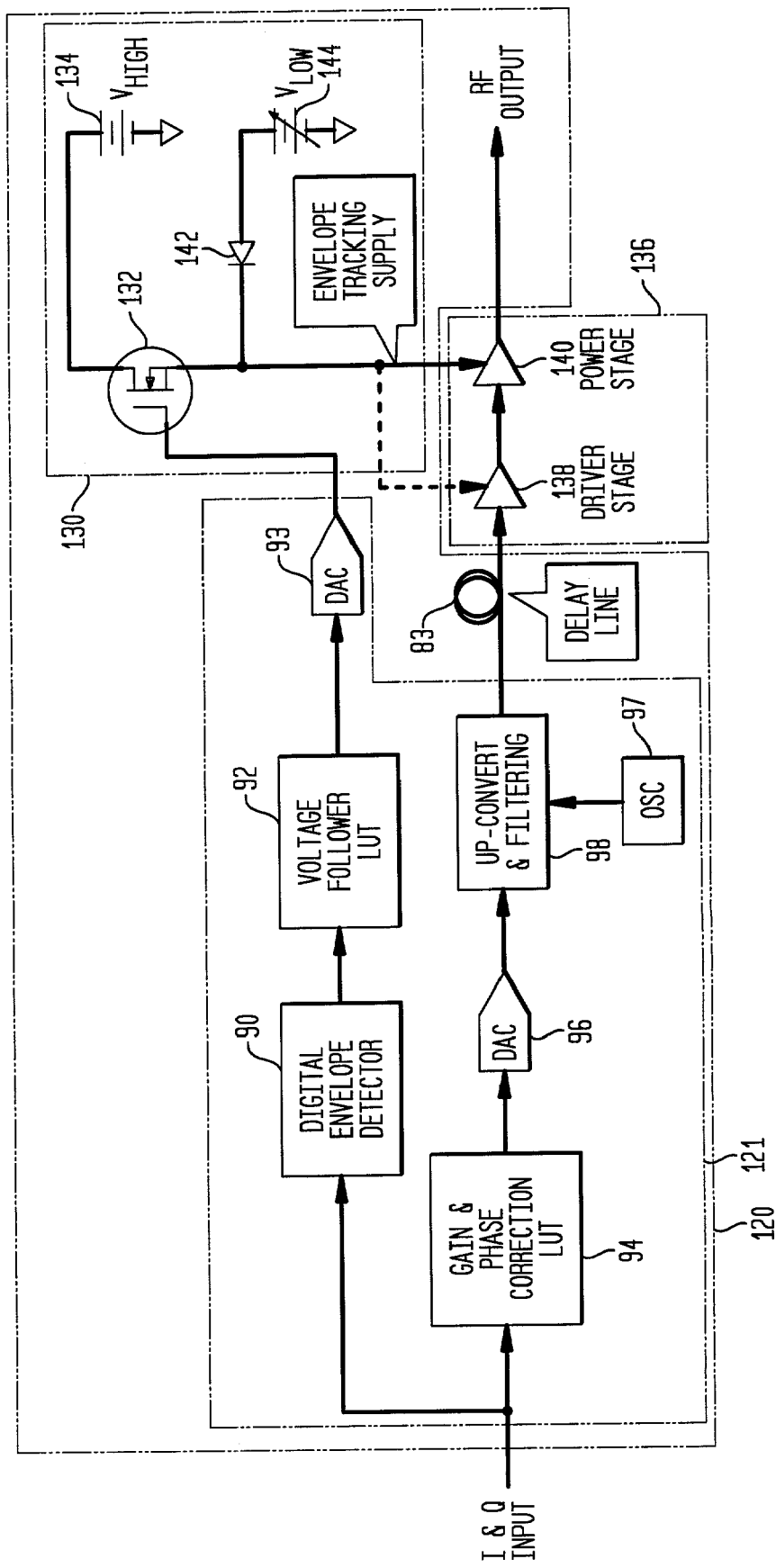
FIG. 6 is a schematic block diagram of another embodiment of a controller of the present invention.

In applications where the digital value of the RF envelope input signal is known, the controller 30 may be modified. In this case, the digital value representing the DC component of the RF signal envelope is obtained directly from the source, for example, if the transmission specifications of a base station are known. FIG. 6 illustrates an embodiment of a controller 120 of the present invention that may be used in this type of application (e.g., base station system) and includes a control unit 121 having a digital envelope detector 90 for directly sampling the digital value and a voltage follower look-up table 92 for providing a DC level (i.e. sets DAC voltage) to a D/A converter 93 for controlling the power supply 130. The power supply 130 includes a transistor 132 connected between a high rail power source 134 and an amplifier 136. The amplifier 136 may include multiple stages, including for example, a driver stage 138 and a power stage 140. A diode 142 and a low rail power source 144 are connected in series between ground and the amplifier 136. The gate of the transistor 132 receives the output of the D/A converter 93. The low rail power source 144 defines a low voltage threshold level, preferably based upon the average power of the output of the amplifier 136, and the high rail power source 134 defines a high voltage threshold level for supplying power to the amplifier 136, preferably based upon the peak value for the amplifier 136. The low rail power source 144 is preferably adjustable. Further, the transistor 132 is preferably an n-type metal-oxide-silicon field-effect transistors (MOSFETs) selected based upon the power requirements of the amplifier 136. The power supply 130 does not include a second transistor and bias voltage source 76, thereby reducing power consumption, but requiring more precise setting of the low threshold value for the low rail power source 144.

The control unit 121 also includes a gain and phase correction look-up table 94 that provides predistortion to the digital base-band I&Q (in-phase and quadrature) signal. The predistorted signal is then applied to the D/A converter 96 and connected to an up-convert and filtering component 98 to translate from a baseband frequency to an RF signal. The up-convert and filtering component 98 may be provided in any known manner. For example, the up-convert and filtering component 98 may be configured as a transmit radio with an oscillator 97 connected to the up-convert and filtering component 98. Up-conversion is provided by mixing the oscillator 97 and base-band (i.e., D/A converter 96 output) signals in an RF mixer. The output of the mixer is the sum and difference components of the oscillator 97 and base-band signals. A band-pass filter is used to select the appropriate RF output component. More than one up-conversion may be provided (e.g., base-band to intermediate frequency (IF) and then IF to RF). A delay line 83 is again provided to compensate for delay through the digital detection and look-up components. A micro-controller and computer interface are also provided in the same manner as in the controller 30 for modifying the values in the voltage follower look-up table 92 and gain and phase correction look-up table 94.

Operational Description

In operation, the controller 30 provides a modulated power supply 34 for powering an amplifier 32 for more efficient operation of the amplifier 32. The controller 30 linearizes the RF signal by applying the opposite effect to changes in the RF signal gain and phase (i.e., predistortion). A sample of the RF envelope signal is rectified by the detector 36 with the RF component filtered off. The resultant DC representation of the RF envelope is converted to a discrete digital value by the A/D converter 46.

The discrete digital value is converted to amplitude, phase and DC voltage correction values for the RF signal using the look-up table 48. A polar modulator 62 applies analog converted values based upon the digital correction values to the RF signal to compensate for changes in amplitude and phase. The amplitude and phase correction levels are provided after the preamp stage 84 of the amplifier 32.

An analog converted DC value from the look-up table 48 is output to the power supply 34, which is then provided as a DC voltage level to the amplifier 32 (i.e., driver stage 78 and/or power stage 80). The low rail power source 68 is adjustable and defines a low power threshold based upon the average power of the output of the amplifier 32. The high rail power source 66 defines the peak value and is based upon the highest rated value for the amplifier 32. This value is fixed for a particular amplifier 32. In operation, the diode 74 allows current to flow (i.e., conduct) from the low rail power source 68 to power the amplifier 32 when the DC voltage value from the look-up table 48 is below the low threshold for the low rail power source 68. When the DC voltage value from the look-up table 48 is above the low threshold, the diode 74 blocks current, and current flows from the high rail power source 66 to power the amplifier 32 (i.e., first and second transistors 70 and 72 conduct).

The gate voltage applied to the first and second transistors 70 and 72 based upon the DC voltage level from the D/A converter 64, causes the transistors 70 and 72 to conduct proportionally to that DC voltage level, and adjust the voltage level from the high rail power source 66 to change proportionally to the amplitude of the RF envelope. Essentially, linear transitioning is provided by the first and second transistors 70 and 72. The first transistor 70 conducts from the high rail power source 66 and the second transistor 72 allows for variance in the setting of the low threshold voltage of the low rail power source 68.

The delay line 82 is used to delay the RF signal as is needed because of the delay through the control unit 31. Also, the values in the lookup table 48 may be modified as needed to compensate for delay or external conditions, such as, for example, changes in operating temperature or frequency.

The controller 120 shown in FIG. 6 also operates to provide a modulated power supply 130 for powering an amplifier 136 for more efficient operation of the amplifier 136. A discrete digital value for the RF envelope signal is supplied directly to the digital envelope detector 90. The discrete value is converted to a DC voltage correction value for the RF signal using the voltage follower look-up table 92. The discrete value for the RF envelope signal is also supplied directly to the gain and phase correction look-up table 94. The discrete value is converted to an amplitude (i.e., gain) and phase correction value using the gain and phase correction look-up table. The up-convert and filtering component 98 and OSC 97 apply analog converted correction values based upon the digital correction values to the RF signal to compensate for changes in amplitude and phase. A delay line 83 is used to delay the amplitude and phase corrected RF signal due to the delay through the digital voltage correction components.

The DC voltage correction value for the RF signal determined using the voltage follower look-up table 92 is output to the power supply 130, which is then provided as a DC voltage level to the amplifier 136 (i.e., driver stage 138 and/or power stage 140). The low rail power source 144 is adjustable and defines a low power threshold based upon the average power of the output of the amplifier 136. The high rail power source 134 defines the peak value and is based upon the highest rated value for the amplifier 136. This value is fixed for a particular amplifier 136. In operation, the diode 142 allows current to flow (i.e., conduct) from the low rail power source 144 to power the amplifier 136 when the DC voltage value from the voltage follower look-up table 92 is below the low threshold for the low rail power source 144. When the DC voltage value from the voltage follower look-up table 92 is above the low threshold, the diode 142 blocks current, and current flows from the high rail power source 134 to power the amplifier 136 (i.e., transistor 132 conducts).

The gate voltage applied to the transistor 132 based upon the DC voltage level from the D/A converter 93 causes the transistor 132 to conduct proportionally to that DC voltage level, and adjust the voltage level from the high rail power source 134 to change proportionally to the amplitude of the RF envelope. Essentially, linear transitioning is provided by the transistor 132, which conducts from the high rail power source 134.

Figure 7:
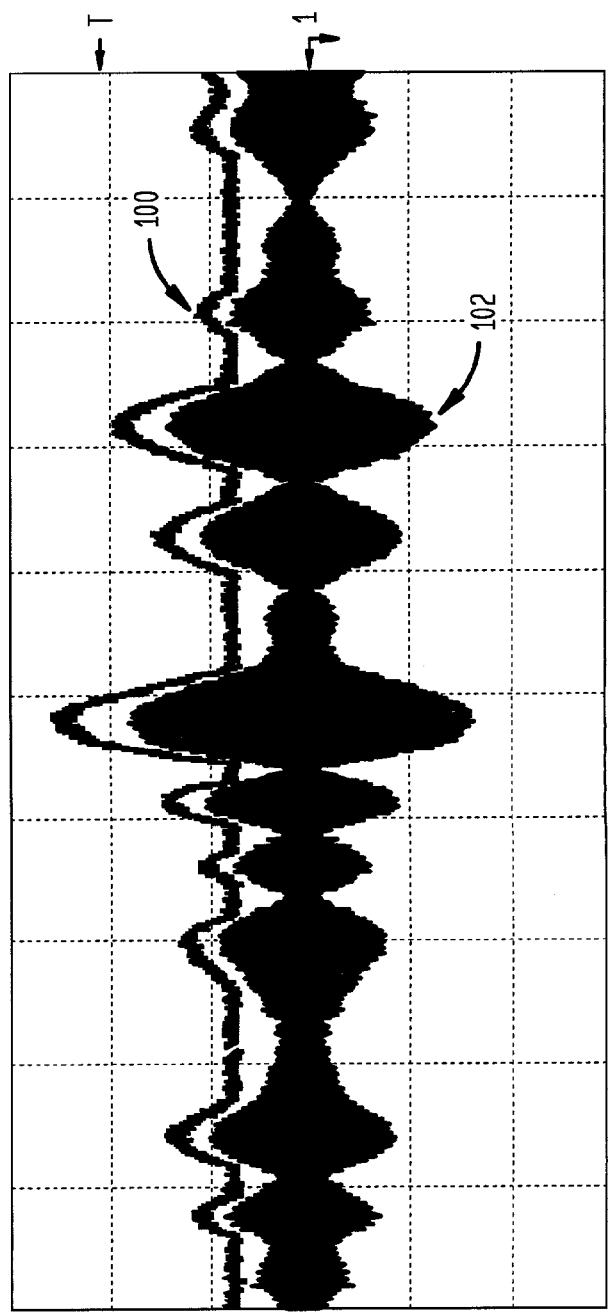
FIG. 7 is a waveform illustrating the modulated power supply provided to an amplifier using the controller of the present invention.

Thus, as shown in FIG. 7, the voltage supplied to the amplifier 32 more closely tracks the RF envelope signal. The voltage level, represented by waveform 100, increases and decrease proportionally based upon the RF envelope signal represented by waveform 102. When the voltage level drops below the low threshold level of the low rail power source 68, the voltage is clipped as indicated by the flat portions of waveform 100. As the voltage level increases above the low threshold level, the voltage level controlled by first and second transistors 70 and 72 increases proportionally to the increase in the RF envelope signal, thereby providing dynamic tracking of the RF envelope signal. As should be appreciated, the controller 120 operates to provide the same advantages as the controller 30, and in particular increases and decreases the voltage level of the power supply 130 proportionally based upon the RF envelope signal as shown in FIG. 7.

Thus, a controller of the present invention provides a modulated power supply for increasing the efficiency of an amplifier by reducing dissipated energy. The controller detects changes in the RF envelope of an input signal, and dynamically adjusts the output based upon these changes. Variations in gain, phase and DC voltage are compensated synchronously using look-up table(s).

The description of the invention is merely exemplary in nature and, thus, variations that do not depart from the gist of the invention are intended to be within the scope of the invention. Such variations are not to be regarded as a departure from the spirit and scope of the invention as claimed.

What is claimed is:

1. A controller for an RF amplifier, the controller comprising:
   a power supply for supplying power to the RF amplifier; and
   a control unit for detecting an RF envelope of a signal input to the RF amplifier includes a look-up table having correction values that are addressed based upon the detected RF envelope signal, wherein the control unit performs predistortion and controls the power supply based on the correction values; and
   a micro-controller and interface for modifying the correction values in the look-up table without feedback.

2. The controller according to claim 1, wherein the control unit is configured for controlling the power supply such that power output from the power supply is varied linearly.

3. The controller according to claim 1, wherein the control unit adjusts the RF envelope signal to provide predistortion.

4. The controller according to claim 1, wherein the control unit controls the power supply based upon the correction values and is synchronous with the predistortion.

5. The controller according to claim 4, wherein the correction values comprise amplitude predistortion, phase predistortion and voltage correction values.

6. The controller according to claim 4, wherein the control unit is configured to apply the correction values to the RF envelope.

7. The controller according to claim 1, wherein the power supply is adjustable between a high voltage value and a low voltage value.

8. The controller according to claim 7, wherein a voltage range between the high voltage value and the low voltage value is configurable based upon a setting of the low voltage value.

9. An RF amplifier, comprising:
   a plurality of power stages providing power amplification;
   a power supply for supplying power to the RF amplifier; and
   a control unit for detecting an RF envelope of a signal input to the RF amplifier includes a look-up table having correction values that are addressed based upon the detected RF envelope signal, wherein the control unit performs predistortion and controls the power supply based on the correction values; and
   a micro-controller and interface for modifying the correction values in the look-up table without feedback.

10. The RF amplifier according to claim 9, wherein the plurality of power stages comprise a preamp stage, a driver stage and a power stage.

11. The RF amplifier according to claim 10, wherein the control unit is configured for controlling power supplied to the driver stage and power stage.

12. The RF amplifier according to claim 9, wherein the control unit adjusts the RF envelope signal to provide predistortion.

13. The RF amplifier according to claim 9, wherein the control unit controls the power supply based upon the correction values and is synchronous with the predistortion.

14. The RF amplifier according to claim 13 wherein the correction values comprise amplitude, phase and voltage correction values.

15. The RF amplifier according to claim 13, wherein the control unit is configured to apply the correction values to the RF envelope.

16. The RF amplifier according to claim 9, wherein the power supply is adjustable between a high voltage value and a low voltage value.

17. The RF amplifier according to claim 16, wherein a voltage range between the high voltage value and the low voltage value is configurable based upon a setting of the lower voltage value.

18. A method of controlling an RF amplifier, comprising:
   detecting an RF envelope of a signal input to the RF amplifier;
   addressing stored correction values based on the detected RF envelope signal; and
   performing signal predistortion and controlling power supplied to the RF amplifier based on the correction values, wherein the correction values are modified without feedback.

* * * * *